(12) United States Patent
Mayo et al.

(10) Patent No.: US 8,772,975 B2
(45) Date of Patent: Jul. 8, 2014

(54) APPARATUS AND METHOD FOR IMPLEMENTING A DIFFERENTIAL DRIVE AMPLIFIER AND A COIL ARRANGEMENT

(75) Inventors: Gabriel I Mayo, North Potomac, MD (US); Ryan Tseng, Coronado, CA (US)

(73) Assignee: QUALCOMM Incorporated, San Diego, CA (US)

( * ) Notice: Subject to any disclaimer, the term of this patent is extended or adjusted under 35 U.S.C. 154(b) by 453 days.

(21) Appl. No.: 12/959,257

(22) Filed: Dec. 2, 2010

(65) Prior Publication Data

US 2011/0133570 A1   Jun. 9, 2011

Related U.S. Application Data

(60) Provisional application No. 61/267,329, filed on Dec. 7, 2009.

(51) Int. Cl.
| | | |
|---|---|---|
| *H01F 27/42* | (2006.01) | |
| *H01F 37/00* | (2006.01) | |
| *H01F 38/00* | (2006.01) | |
| *H02M 3/335* | (2006.01) | |

(52) U.S. Cl.
USPC ............................. 307/104; 363/16; 363/17

(58) Field of Classification Search
None
See application file for complete search history.

(56) References Cited

U.S. PATENT DOCUMENTS

| | | | |
|---|---|---|---|
| 4,908,857 A * | 3/1990 | Burns et al. .................. | 379/418 |
| 5,891,183 A | 4/1999 | Zierhofer | |
| 5,892,425 A | 4/1999 | Kuhn et al. | |
| 6,724,255 B2 | 4/2004 | Kee et al. | |
| 6,927,987 B2 * | 8/2005 | Farrington et al. ........ | 363/56.02 |
| 7,310,245 B2 | 12/2007 | Ohbo | |
| 7,904,108 B2 * | 3/2011 | Castaneda et al. ......... | 455/550.1 |
| 2002/0130387 A1 | 9/2002 | Carpentier | |
| 2002/0186114 A1 | 12/2002 | Basteres et al. | |

(Continued)

FOREIGN PATENT DOCUMENTS

| | | |
|---|---|---|
| DE | 102006019887 A1 | 11/2007 |
| EP | 1478045 A1 | 11/2004 |

(Continued)

OTHER PUBLICATIONS

Byung-Wook Min et al: "5a 6 GHz SPDT switchable balun using CMOS transistors", Radio Frequency Integrated Circuits Symposium, 2008. RFIC 2008. IEEE, IEEE, Piscataway, NJ, USA, Jun. 17, 2008, pp. 321-324, XP031284344, ISBN: 978-1-4244-1808-4.

(Continued)

*Primary Examiner* — Jared Fureman
*Assistant Examiner* — Aqeel Bukhari
(74) *Attorney, Agent, or Firm* — Knobbe Martens Olson & Bear LLP

(57) ABSTRACT

Exemplary embodiments are directed to differentially driving a load. An apparatus includes a differential drive amplifier including a switching device coupled with a first output node and a second output node. The first output node and the second output node drive a load network including primary coils. The differential drive amplifier also includes a drive circuit configured to drive the switching device. The drive circuit may be configured to provide a drive signal to the switching device to alter a conductive state of the switching device to produce a first output signal at the first output node and a second output signal at the second output node. The first and second output signals may be substantially equal in magnitude but opposite in polarity relative to a reference voltage.

45 Claims, 14 Drawing Sheets

(56) References Cited

U.S. PATENT DOCUMENTS

| | | |
|---|---|---|
| 2003/0085788 A1 | 5/2003 | Yue |
| 2003/0137383 A1 | 7/2003 | Yang et al. |
| 2003/0206422 A1 | 11/2003 | Gucyski |
| 2003/0222750 A1 | 12/2003 | Kyriazidou |
| 2004/0066236 A1 | 4/2004 | Fujimoto et al. |
| 2006/0001520 A1 | 1/2006 | Kaji et al. |
| 2006/0132274 A1 | 6/2006 | Lee et al. |
| 2006/0232342 A1 | 10/2006 | Floyd et al. |
| 2007/0085617 A1 | 4/2007 | Salerno |
| 2007/0095926 A1 | 5/2007 | Zhu et al. |
| 2008/0074228 A1 | 3/2008 | Erickson et al. |
| 2008/0164840 A1 | 7/2008 | Kato et al. |
| 2008/0186103 A1 | 8/2008 | Chen |
| 2009/0230777 A1* | 9/2009 | Baarman et al. ............ 307/104 |
| 2012/0228959 A1 | 9/2012 | Mayo et al. |

FOREIGN PATENT DOCUMENTS

| | | |
|---|---|---|
| JP | 7272934 A | 10/1995 |
| JP | 2000252125 A | 9/2000 |
| JP | 2004165612 A | 6/2004 |
| JP | 2004520730 A | 7/2004 |
| JP | 2005005685 A | 1/2005 |
| JP | 2005509300 A | 4/2005 |
| JP | 2006005643 A | 1/2006 |
| JP | 2006019506 A | 1/2006 |
| JP | 2006511068 A | 3/2006 |
| JP | 2010141521 A | 6/2010 |
| TW | 200513025 A | 4/2005 |
| WO | WO0231966 A2 | 4/2002 |
| WO | 2004042426 A1 | 5/2004 |
| WO | 2004055839 A1 | 7/2004 |
| WO | 2007101992 A1 | 9/2007 |
| WO | WO2009149464 A2 | 12/2009 |

OTHER PUBLICATIONS

International Search Report and Written Opinion—PCT/US2010/059334—ISA/EPO—May 27, 2011.
Taiwan Search Report—TW099142739—TIPO—Apr. 19, 2013.
European Search Report—EP13153362—Search Authority—Munich—Mar. 4, 2013.
Itoh, N., et al., "Low supply voltage fully integrated CMOS VCO with three terminals spiral inductor", Solid-State Circuits Conference, 1999. ESSCIRC '99. Proceedings of the 25th European Duisburg, Germany Sep. 21-23, 1999, Piscataway, NJ, USA, IEEE, Sep. 21, 1999, pp. 194-197, XP010823538, ISBN: 978-2-86332-246-8, the whole document.

\* cited by examiner

APPARATUS AND METHOD FOR IMPLEMENTING A DIFFERENTIAL DRIVE AMPLIFIER AND A COIL ARRANGEMENT

CLAIM OF PRIORITY UNDER 35 U.S.C. §119

This application claims priority under 35 U.S.C. §119(e) to:

U.S. Provisional Patent Application 61/267,329 entitled "APPARATUS AND METHOD FOR IMPLEMENTING A DIFFERENTIAL DRIVE AMPLIFIER AND A COIL ARRANGEMENT" filed on Dec. 7, 2009, the disclosure of which is hereby incorporated by reference in its entirety.

BACKGROUND

1. Field

Embodiments of the present invention relate generally to noise cancellation, and, more particularly, relate to the configuration of a differential drive amplifier and a coil arrangement.

2. Background

A shortcoming of long range and/or alignment insensitive wireless power systems can be the emission of high levels of conducted and radiated noise. For example, some loosely coupled wireless power systems can utilize high voltages and large primary coils, both of which can contribute to noise emission when signals generated via switching are inputs to the system. Such systems can pose electromagnetic interference challenges when the systems operate near other electronic products (e.g., mobile phones, game controllers, media playback devices, etc.).

A portion of the noise generated by these systems is common-mode. Common-mode noise can be attributed to the use of high voltages and unshielded primary windings with considerable surface area. High voltages may be utilized when a system is operating at or near resonance to overcome weak coupling between the primary and secondary coils. The use of large, unshielded primary windings to transmit power over long distances can further expose surrounding areas to the resultant noise.

BRIEF DESCRIPTION OF THE DRAWINGS

Figure 1:
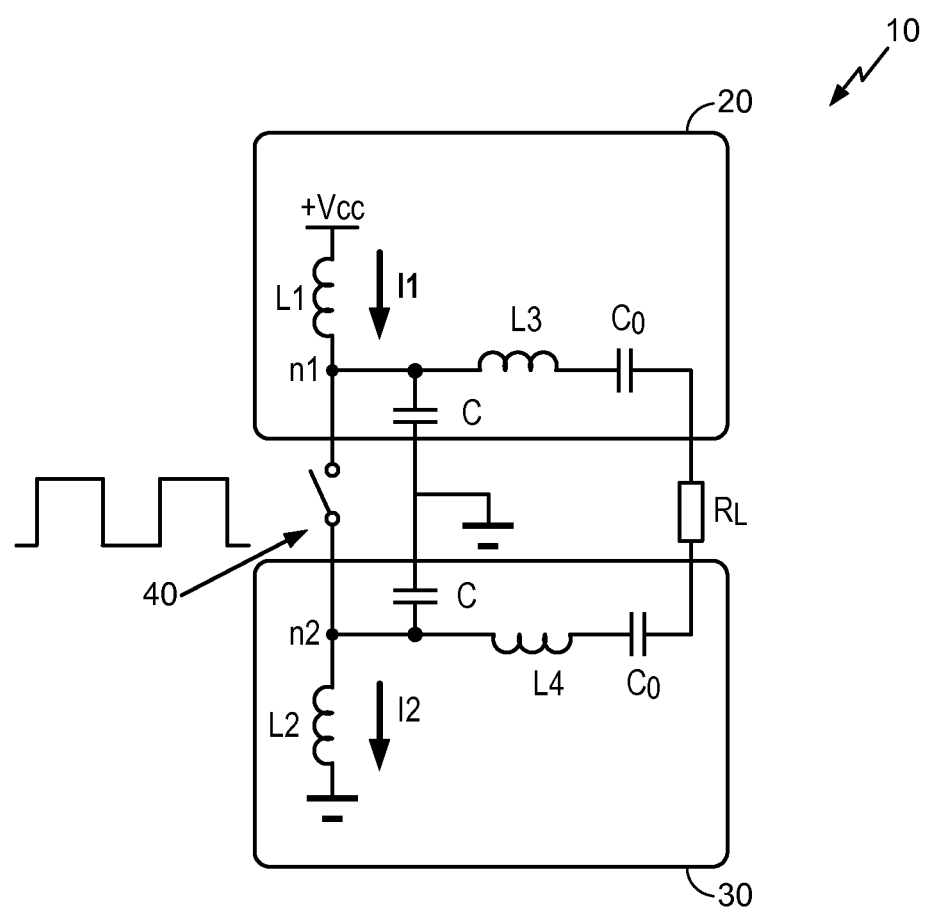
Figure 2A:
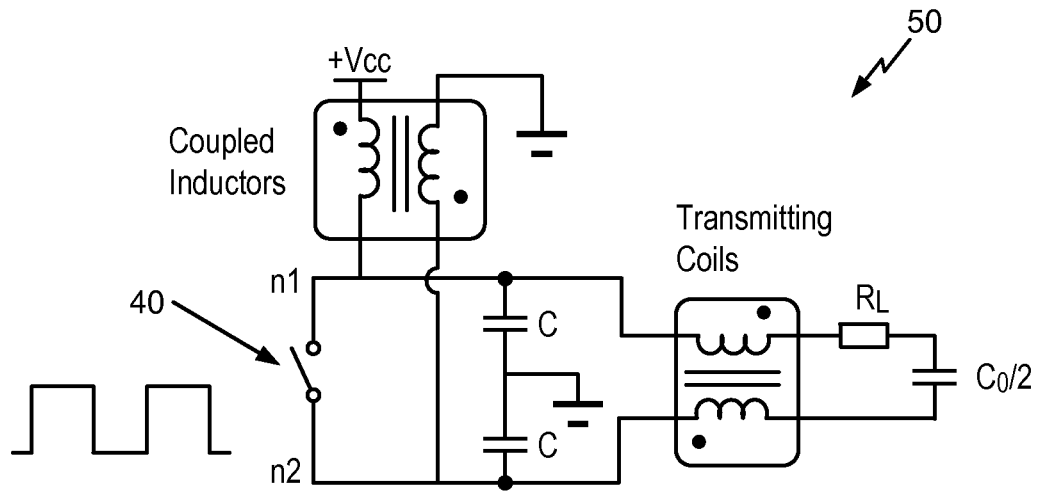
Figure 2B:
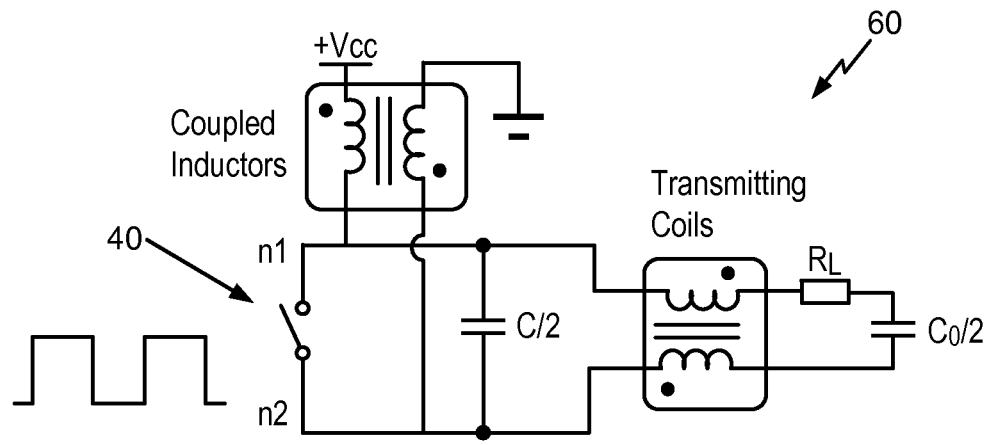
Figure 3:
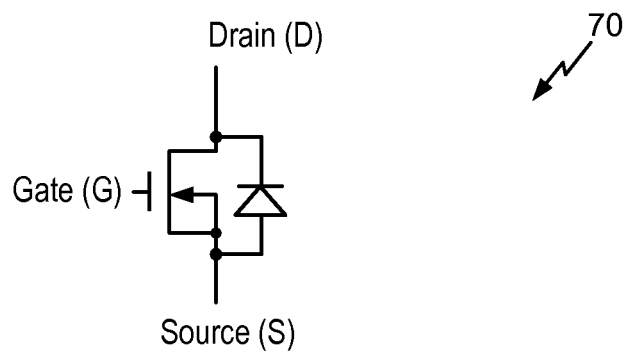
Figure 4:
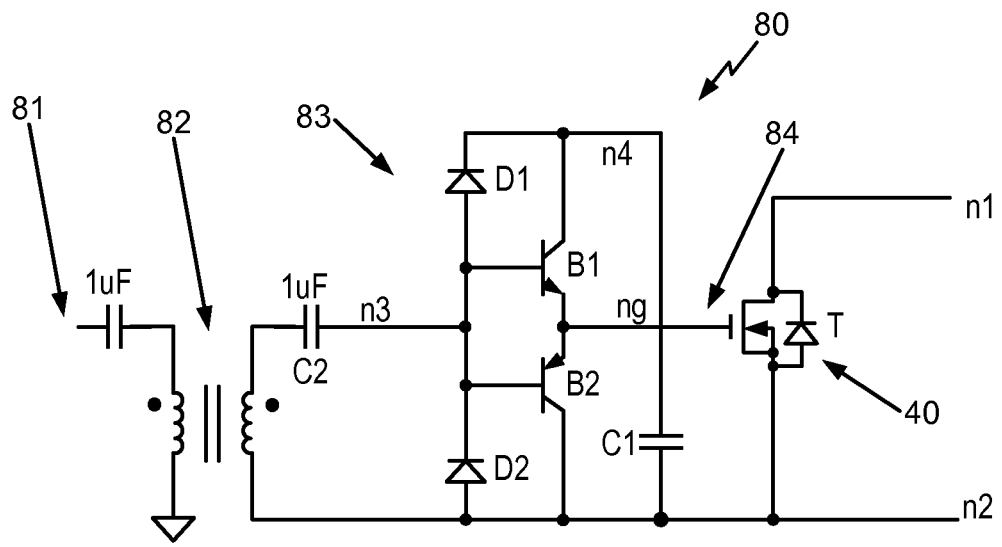
Figure 5:
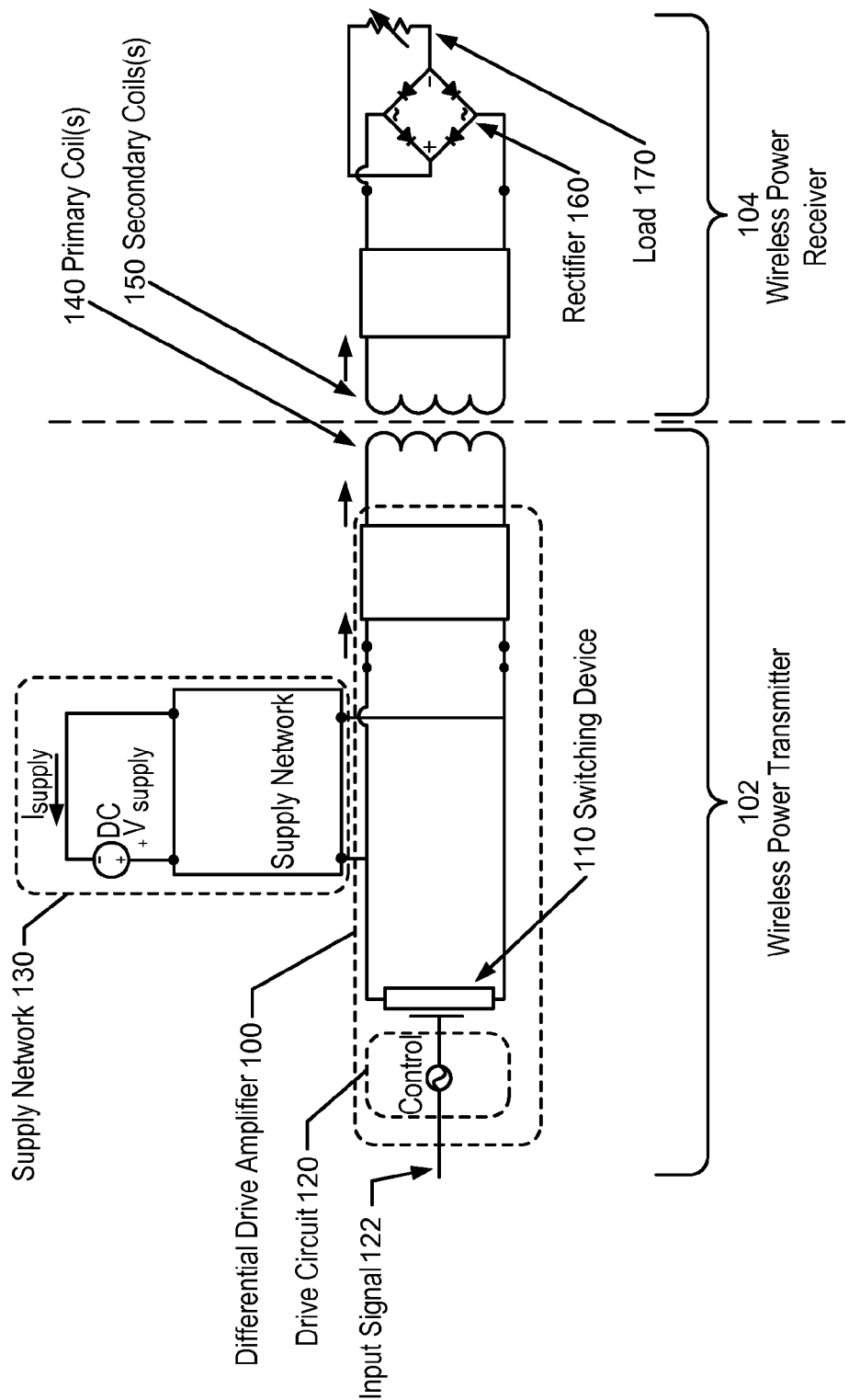
Figure 6:
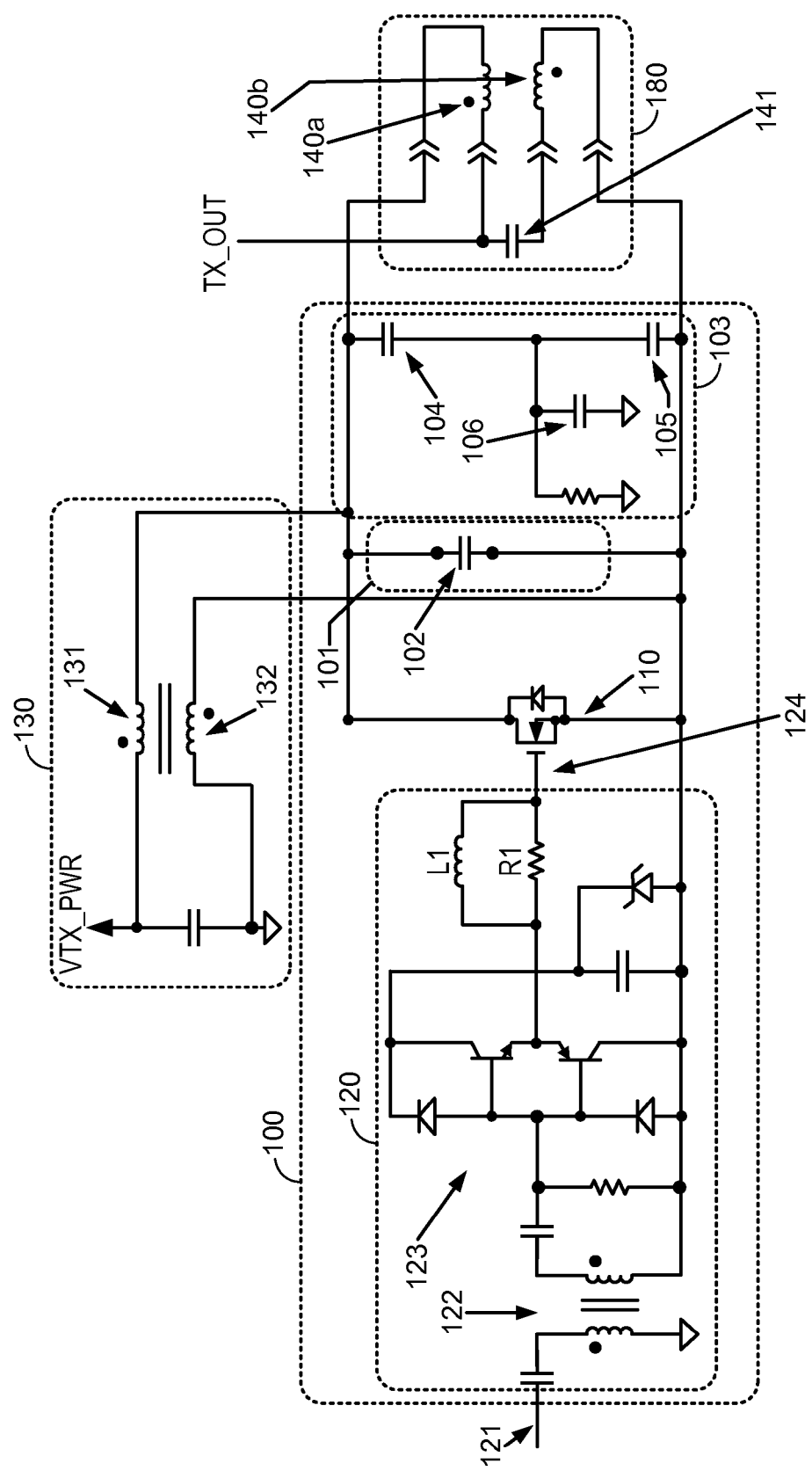
Figure 7:
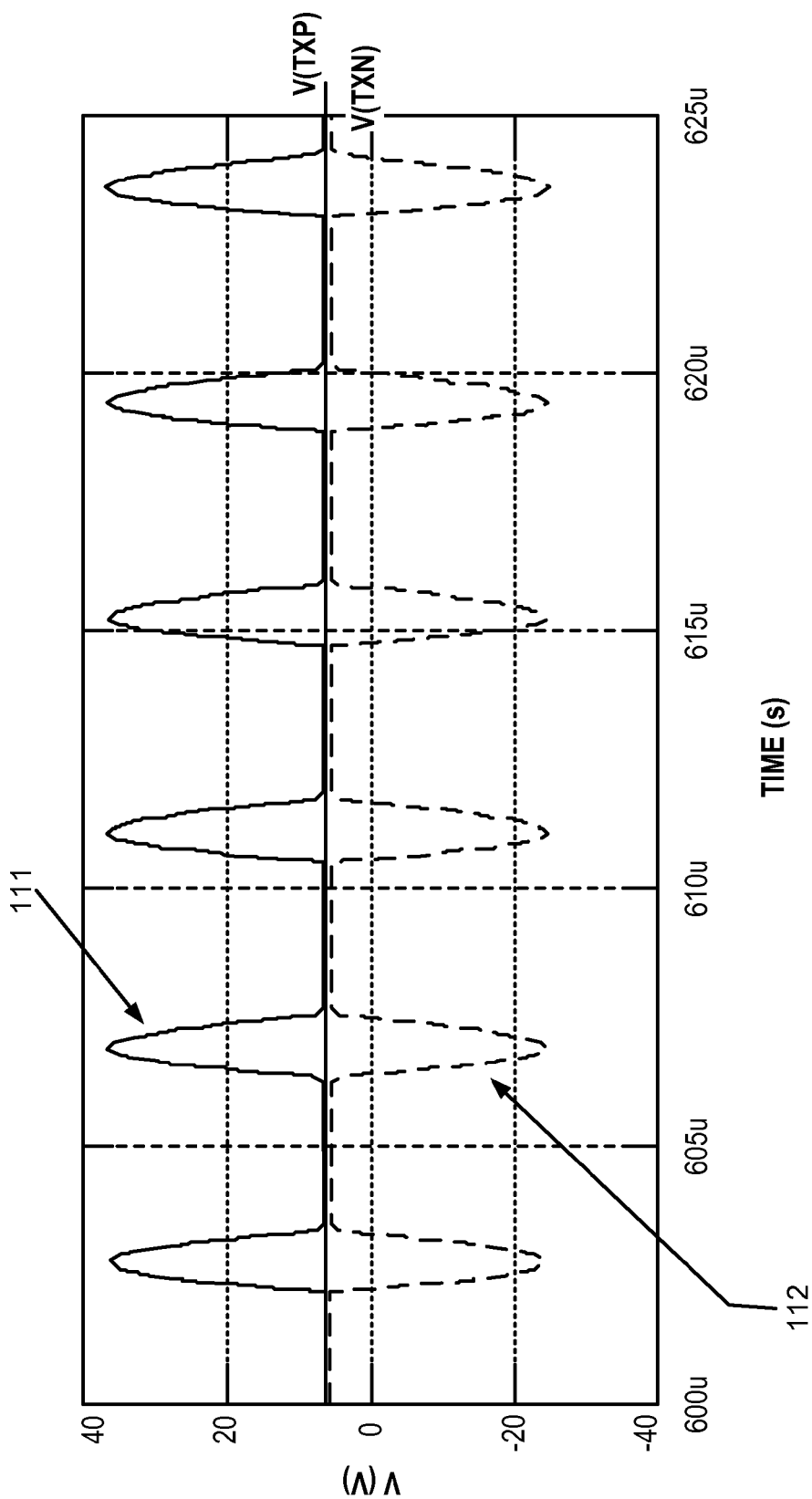
Figure 8:
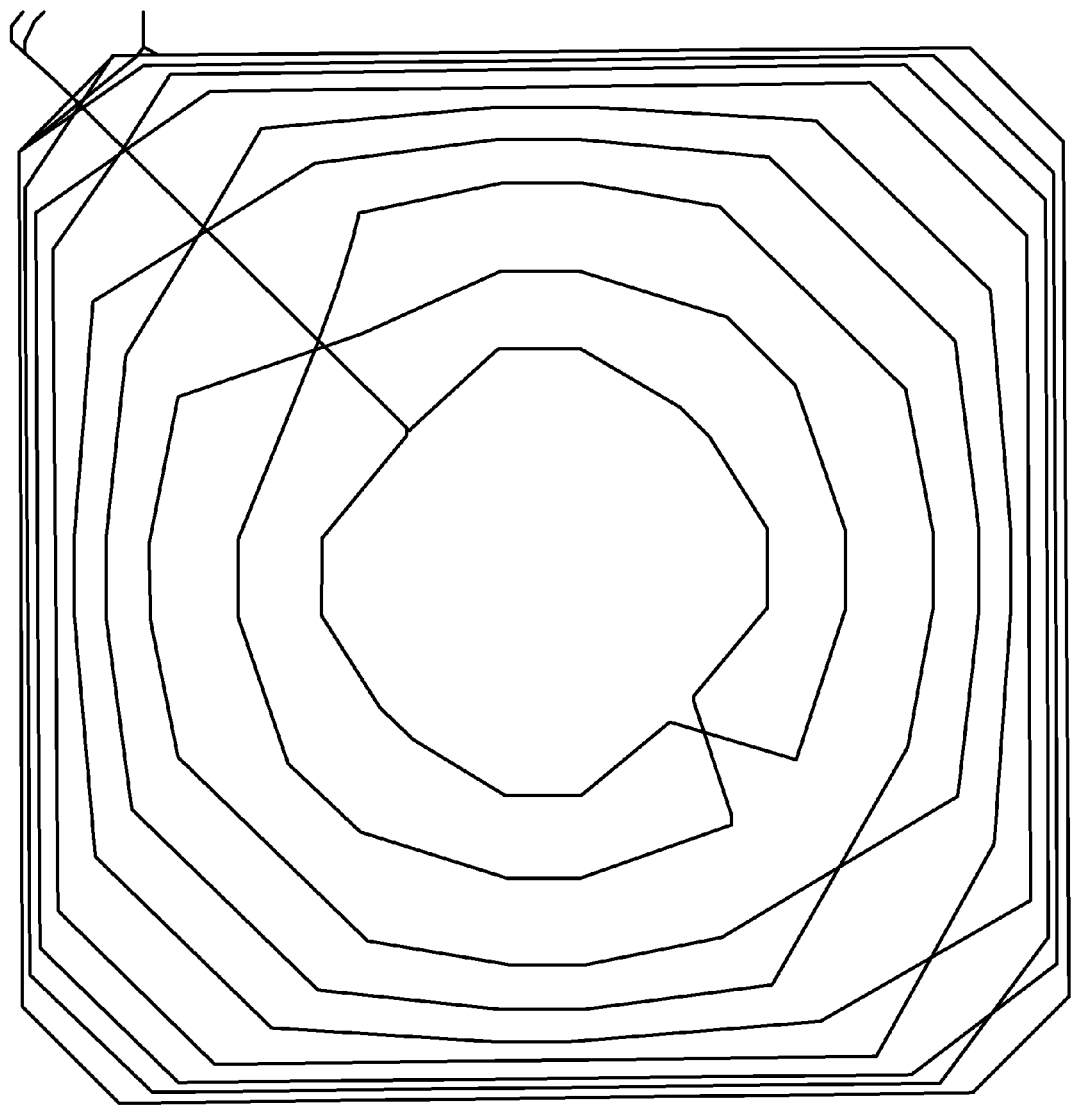
Figure 9:
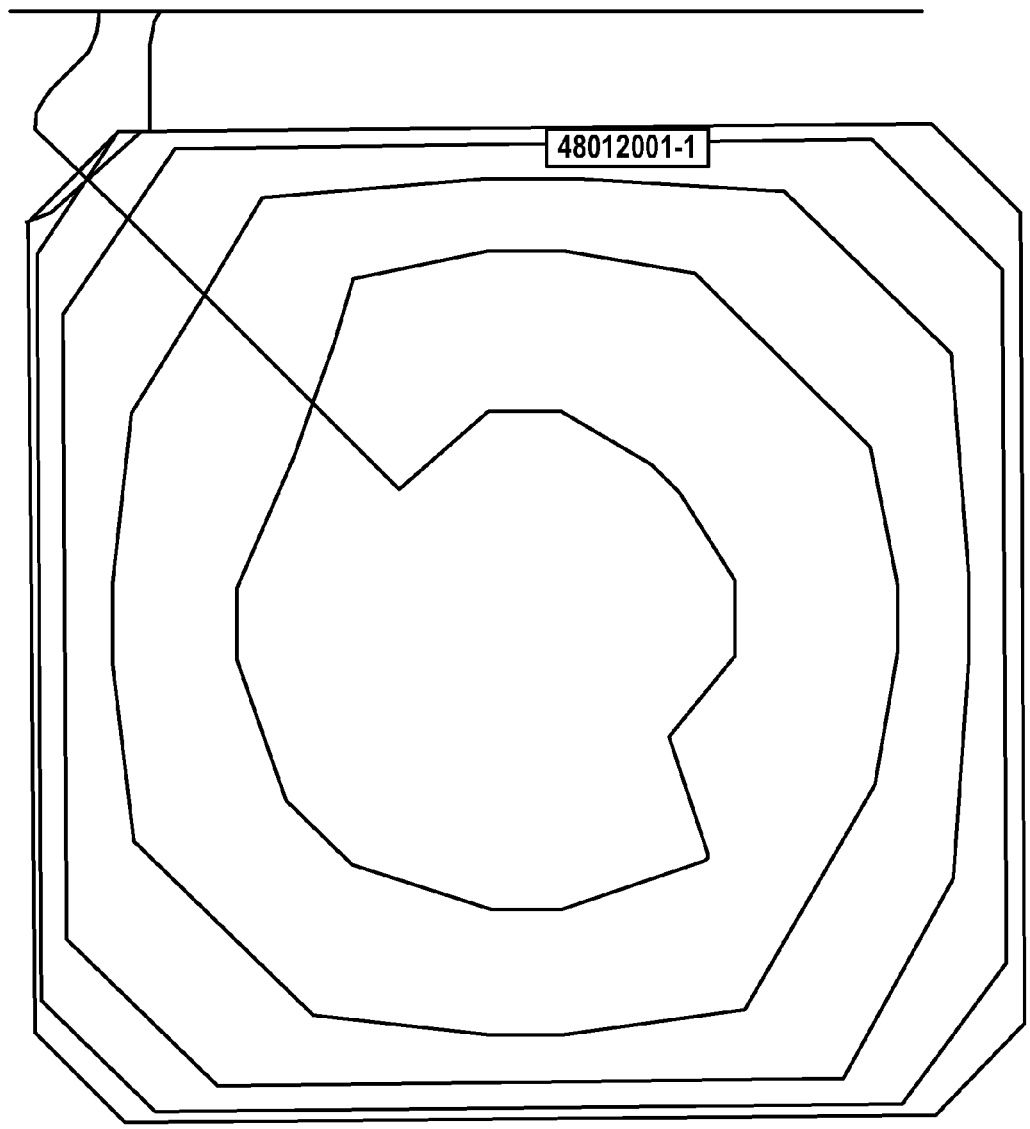
Figure 10:
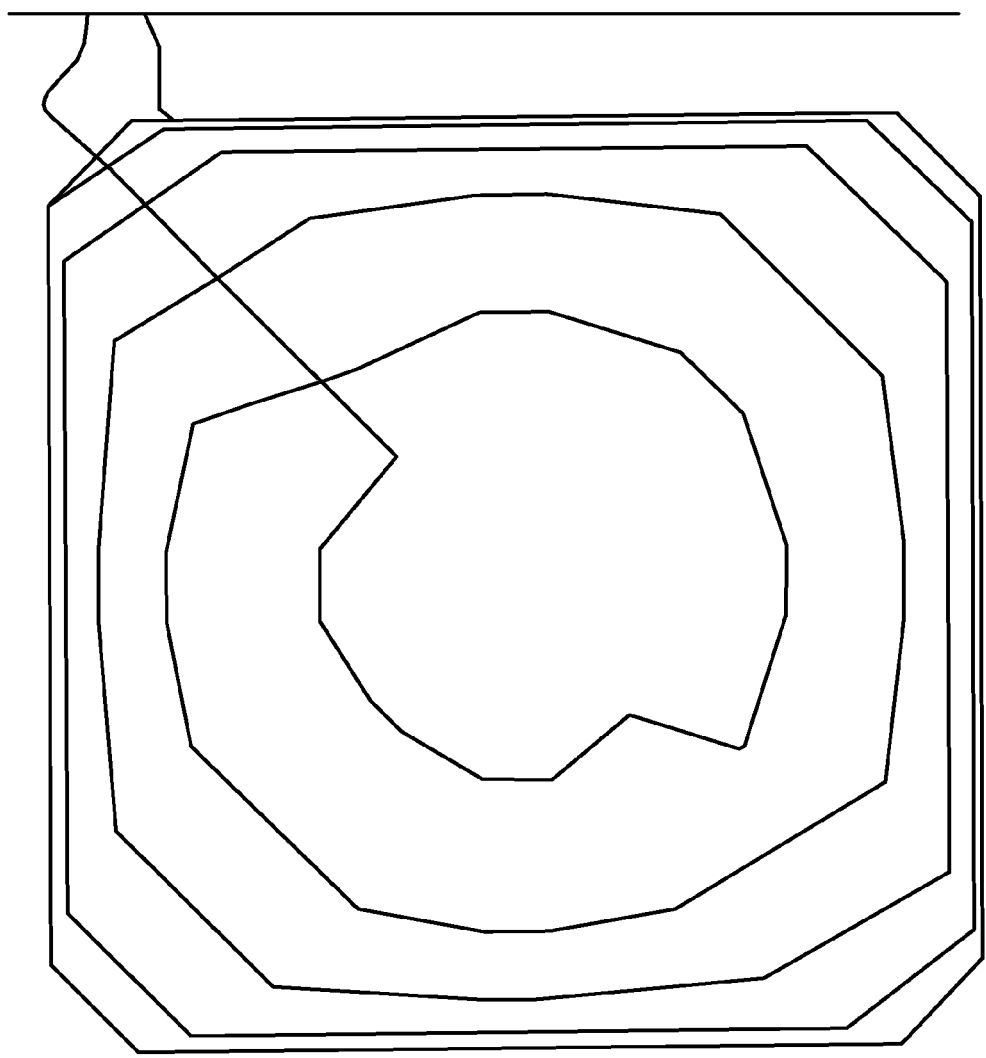
Figure 11:
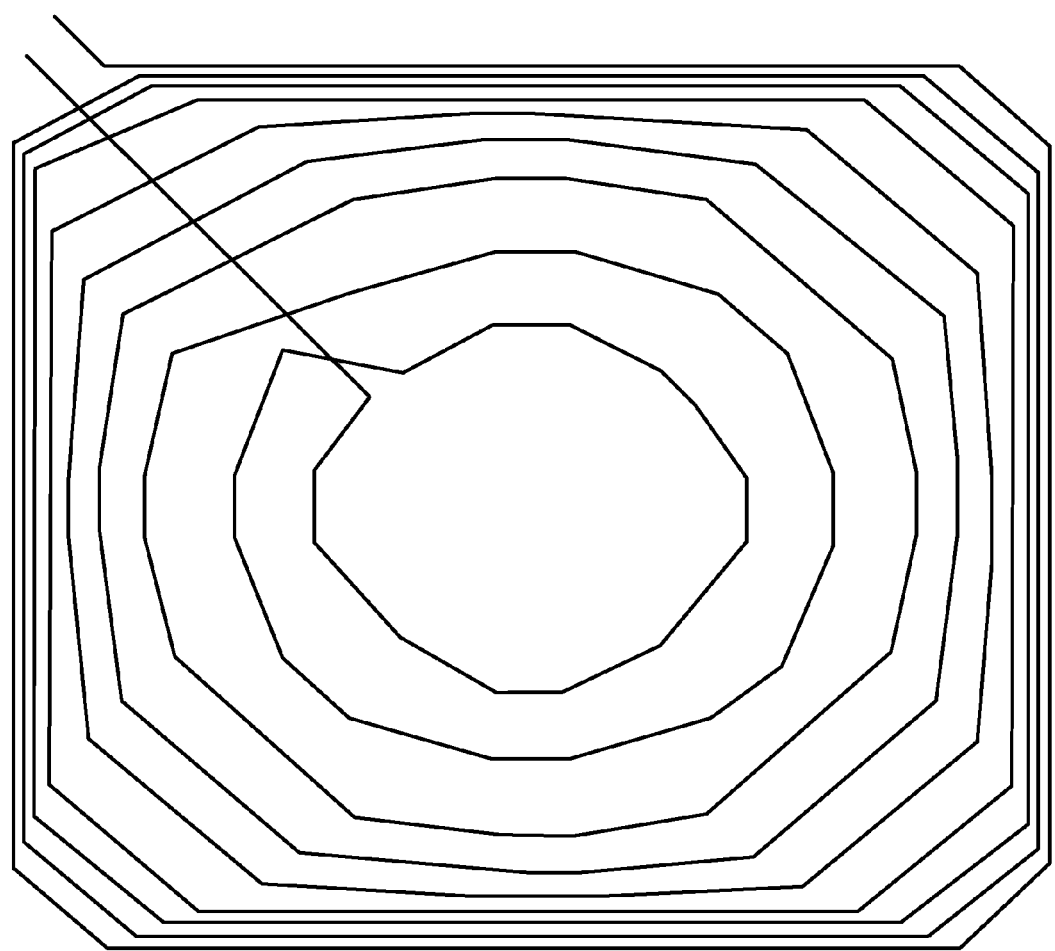
Figure 12:
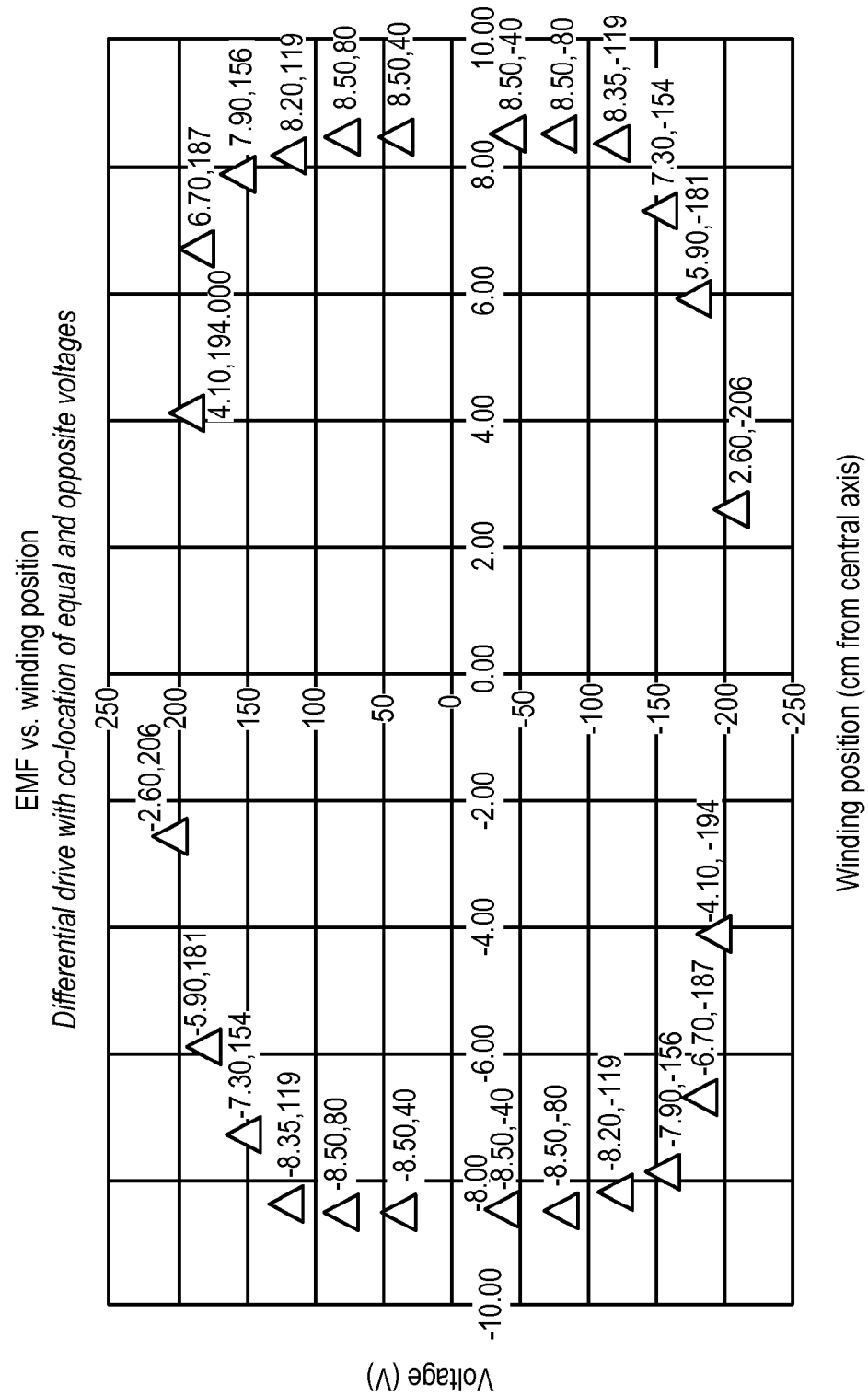
Figure 13:
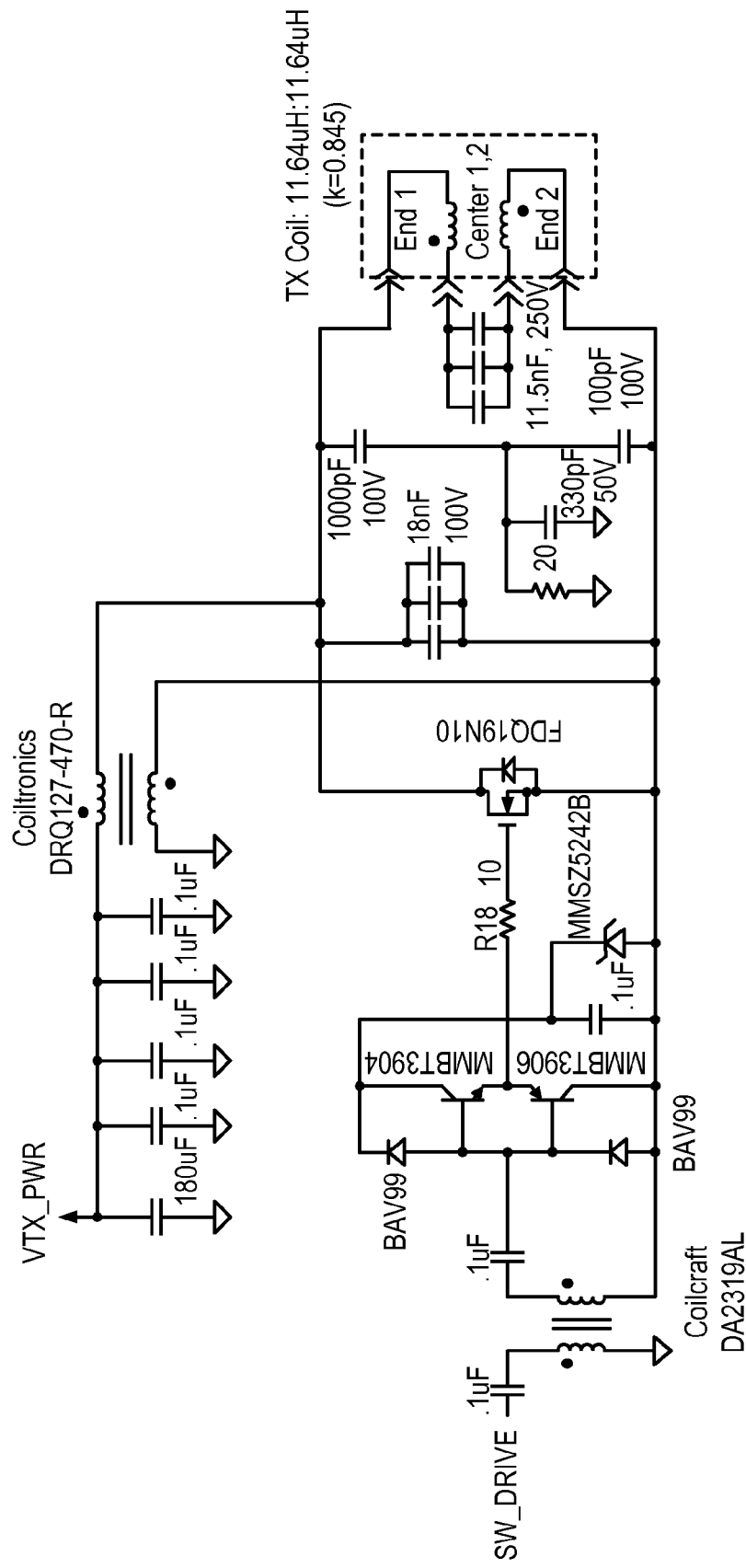
Figure 14:
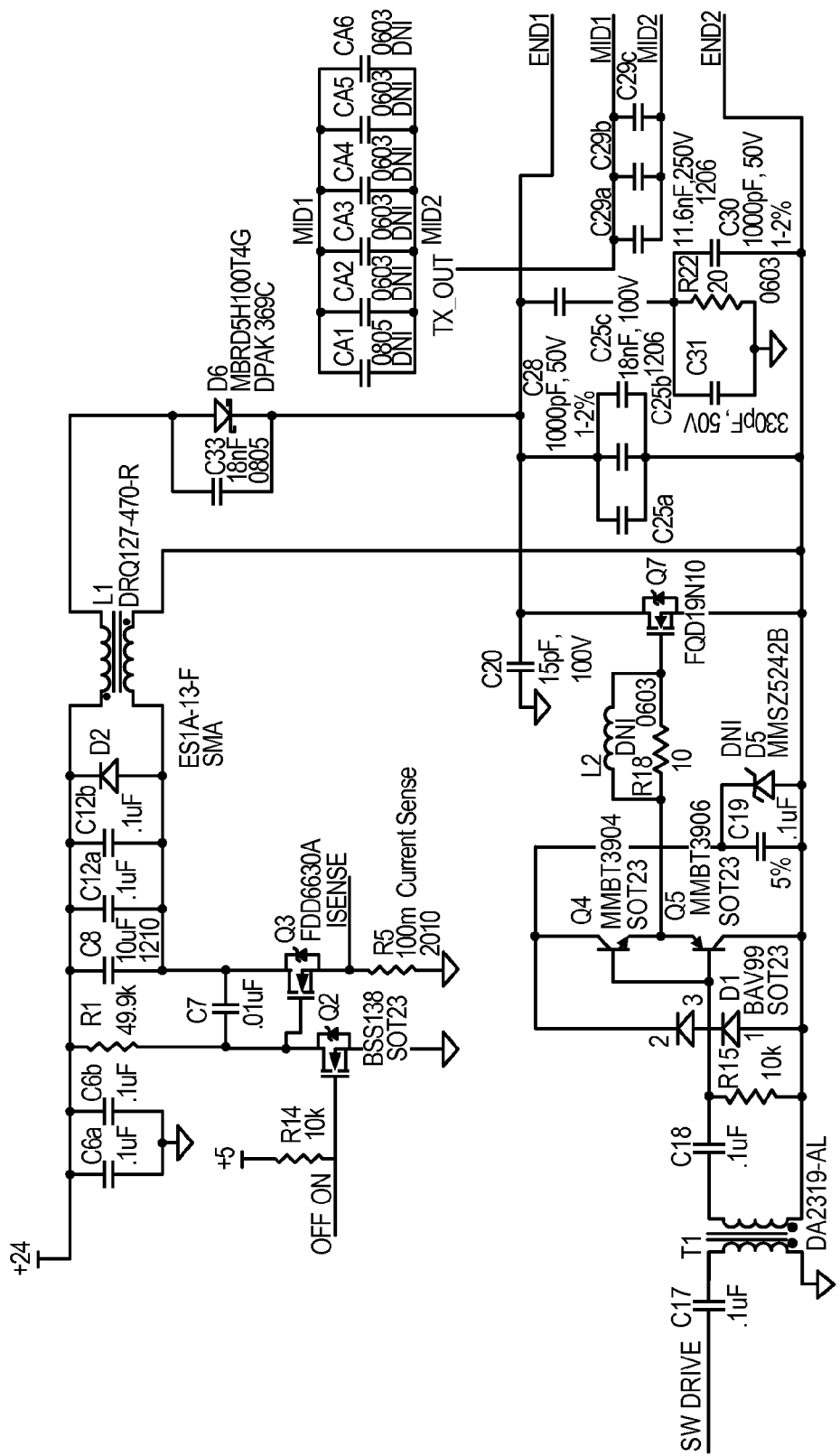
Figure 15:
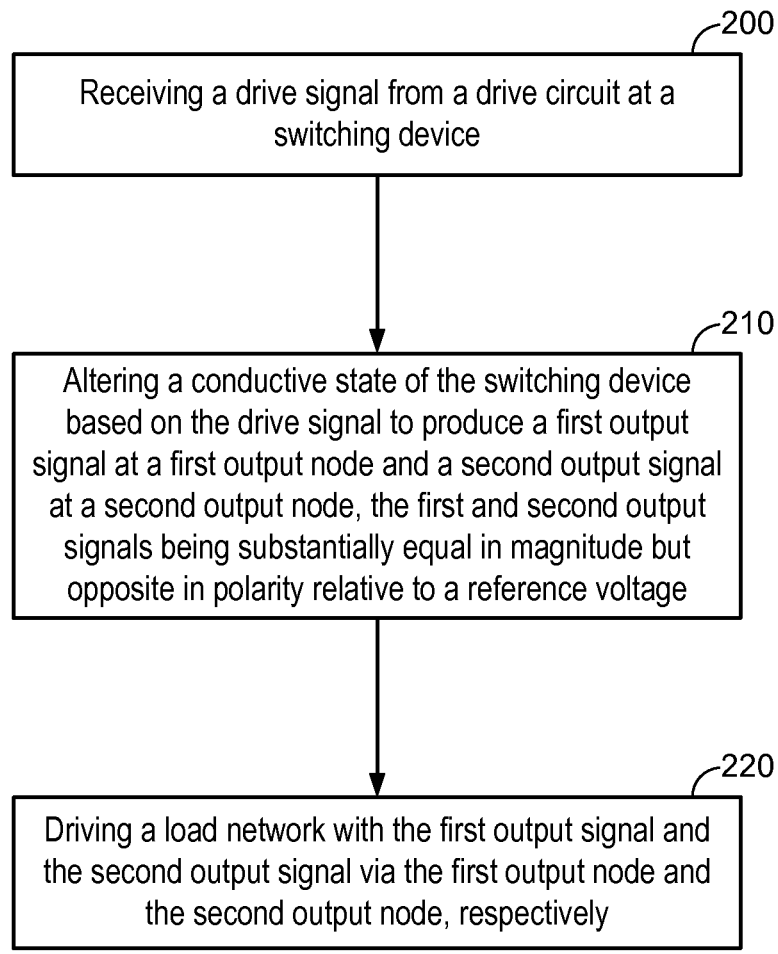

Having thus described the invention in general terms, reference will now be made to the accompanying drawings, which are not necessarily drawn to scale, and wherein:

FIGS. 1, 2a, and 2b are schematic diagrams of single switching device differential drive amplifiers in accordance with various example embodiments of the present invention;

FIG. 3 illustrates an example switching device in accordance with various example embodiments of the present invention;

FIG. 4 illustrates an example drive circuit in accordance with various example embodiments of the present invention;

FIG. 5 illustrates a wireless power system including a wireless transmitter and a wireless receiver according to an example embodiment of the present invention;

FIG. 6 illustrates a schematic diagram of a wireless power transmitter including a differential drive amplifier according to an example embodiment of the present invention;

FIG. 7 illustrate differential output signals according to various example embodiments of the present invention;

FIG. 8 illustrates a two coil arrangement for planar voltage co-location according to various example embodiments of the present invention;

FIG. 9 illustrates a first coil layout for planar voltage co-location according to various example embodiments of the present invention;

FIG. 10 illustrates a second coil layout for planar voltage co-location according to various example embodiments of the present invention;

FIG. 11 illustrates a two coil arrangement for planar voltage co-location on a coordinate axis according to various example embodiments of the present invention;

FIG. 12 is a graph of the measured voltage versus distance from a center point of the two coil arrangement of FIG. 10 according to various example embodiments of the present invention;

FIG. 13 illustrates a schematic diagram of another wireless power transmitter including a differential drive amplifier according to an example embodiment of the present invention;

FIG. 14 illustrates a schematic diagram of yet another differential drive amplifier according to an example embodiment of the present invention; and FIG. 15 illustrates a flow chart of one example method of the present invention.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Example embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

Terms such as "substantially," "about," "approximately" or the like as used in referring to a relationship between two objects is intended to reflect not only an exact relationship but also variances in that relationship that may be due to various factors such as the effects of environmental conditions, common error tolerances or the like. It should further be understood that although some values or other relationships may be expressed herein without a modifier, these values or other relationships may also be exact or may include a degree of variation due to various factors such as the effects of environmental conditions, common error tolerances or the like.

The term "wireless power" is used herein to mean any form of energy associated with electric fields, magnetic fields, electromagnetic fields, or otherwise that is transmitted between a transmitter to a receiver without the use of physical electrical conductors.

Various example apparatuses of the present invention are described herein that include a differential drive amplifier. According to some example embodiments, the differential drive amplifier may include a single switching device (e.g., transistor) for receiving a single control signal (e.g., single gate drive signal) and generating differential output signals that are substantially equal and opposite with respect to each other. Due to the equal and opposite relationship between the differential output signals, the signals may be used to reduce or substantially eliminate common-mode noise that is present in the input signal. As such, the differential drive amplifier may be included in, for example, wireless power systems to reduce the conducted and radiated noise of the systems. Further, some example embodiments of the present invention also support soft-switching functionality and maintain a phase angle versus output power relationship of a Class E amplifier.

According to one example embodiment of the present invention, a differential drive amplifier is provided. The differential drive amplifier may include a switching device. The switching device may be in communication or coupled with a first output node and a second output node, wherein the first output node and the second output node drive a load network. The differential drive amplifier may also include a drive circuit configured to drive the switching device, wherein the drive circuit is configured to provide a drive signal to the switching device to alter a conductive state of the switching device to produce a first output signal at the first output node and a second output signal at the second output node. The first and second output signals may be substantially equal in magnitude but opposite in polarity relative to a reference voltage.

Another example embodiment is a wireless power transmitter. The wireless power transmitter may include a differential drive amplifier having a first output node and a second output node, a supply network configured to provide power to the differential drive amplifier, and a load network in communication or coupled with the first output node and the second output node. The differential drive amplifier may comprise a switching device in communication or coupled with the first output node and in communication or coupled with the second output node, and a drive circuit configured to provide a drive signal to the switching device. The switching device may be configured to receive the drive signal and alter a conductive state of the switching device to produce a first output signal at the first output node and a second output signal at the second output node. The first and second output signals may be substantially equal in magnitude but opposite in polarity relative to a reference voltage.

Another example embodiment is a wireless power system. The wireless power system may include a wireless power receiver and a wireless power transmitter. The wireless power receiver may include at least one secondary coil. The wireless power transmitter may include a differential drive amplifier having a first output node and a second output node, a supply network configured to provide power to the differential drive amplifier, and a load network. The differential drive amplifier may comprise a switching device in communication or coupled with the first output node and the second output node, and the load network may be driven via the first output node and the second output node. The differential drive amplifier may also include a drive circuit configured to provide a drive signal to the switching device. The switching device may be configured to receive the drive signal and alter a conductive state of the switching device to produce a first output signal at the first output node and a second output signal at the second output node. The first and second output signals may be substantially equal in magnitude but opposite in polarity relative to a reference voltage.

According to another example embodiment of the present invention, an example apparatus is provided, which includes a means for switching. The means for switching may be in communication or coupled with a first output node and a second output node, wherein the first output node and the second output node drive a load network. The apparatus may also include a means for driving the switching device, wherein the means for driving the switching device is configured to provide a drive signal to the switching device to alter a conductive state of the switching device to produce a first output signal at the first output node and a second output signal at the second output node. The first and second output signals may be substantially equal in magnitude but opposite in polarity relative to a reference voltage.

Yet another example embodiment of the present invention is an example method. The example method may comprise receiving a drive signal from a drive circuit at a switching device, and altering a conductive state of the switching device based on the drive signal to produce a first output signal at a first output node and a second output signal at a second output node. The first and second output signals may be substantially equal in magnitude but opposite in polarity relative to a reference voltage. The example method may also include driving a load network with the first output signal and the second output signal via the first output node and the second output node, respectively.

Another example embodiment of the present invention is an example apparatus. the example apparatus may include a first coil driven by a first signal, and a second coil driven by a second signal. The first and second signals may be substantially equal in magnitude but opposite in polarity relative to a reference voltage. The first coil and the second coil may have a spiral configuration within a common plane that provides for co-location of substantially equal and opposite voltages within the first and second coils, respectively, at any location on the common plane.

Various example embodiments described herein provide for the generation of differential, opposing signals that are capable of limiting or eliminating common mode noise that would otherwise be output from an amplifier. The inversely oriented replica signals, when brought into close proximity to each other, may affect the fields generated by the signals in a manner that substantially cancels or destroys undesired noise. According to some example embodiments of the present invention, a single switching device is utilized for generating a first output signal and a second output signal. The first output signal and the second output signal (collectively referred to as differential output signals) may be substantially equal in magnitude, but opposite in polarity, relative to a reference voltage. According to various example embodiments, the differential output signals may be generated in a manner that involves a reduction in the quantity of active components over conventional solutions. The differential output signals may be used to drive a load network that may comprise a variety of components, including, for example, one or more coils or windings. According to various example embodiments, a differential drive amplifier, such as the single switching device transistor differential drive amplifier described herein, may be utilized in conjunction with a coil arrangement that co-locates high and low voltages of differential output signals for noise reduction with little or no impact on magnetic field generation.

According to various example embodiments, voltages are referred to as being "co-located" when a two substantially equal in magnitude, but opposite in polarity, voltages are present in substantially the same location. Some example embodiments of the present invention generate co-located voltages through the use of tightly coupled coil conductors having an arrangement that provide for substantially equal in magnitude, but opposite in polarity, voltages at a given location as further described below. The conductors in one or more primary coils may be positioned physically close to one another to generate co-located voltages. According to some example embodiments, if implemented in this manner, inter-coil capacitive coupling may dominate the capacitive coupling to ground, and the electric field projected by the primary coil can approach zero.

Together, the differential drive amplifier and the coil arrangement, according to various example embodiments, dramatically reduce the magnitude of a signal that is capacitively connected to both ground and surrounding electronic devices. As a result, common mode emissions and interference with other electronics may be reduced.

Various example embodiments of the present invention also increase or maximize the efficiency of wireless power transfer, for example, for charging the batteries of, or otherwise powering, one or more portable devices (e.g., mobile phones, MP3 players, portable projectors, digital cameras, and the like). Some example embodiments utilize minimal design requirements and reduce the component requirements thereby reducing costs. Additionally, while example embodiments described herein may be directed to wireless power transfer, example embodiments of the differential drive amplifier may be implemented in a wide range of applications, not limited to wireless power systems.

FIG. 1 depicts a schematic diagram of an example single switching device differential drive amplifier 10 according to some example embodiments of the present invention. The amplifier 10 includes an upper RLC (resistor/inductor/capacitor) network 20 connected to a supply voltage (+Vcc), and a lower RLC network 30 connected to ground. The upper network 20 and the lower network 30 share a switching device 40, which floats between the two networks. The switching device 40 may receive a control or drive signal that may control the switching operations of the switching device 40. The switching device 40 may also define two output nodes n1 and n2, where differential output signals are respectively present. The control or drive signal may cause the switching device to alter its conductive state. In this manner, differential output signals may be produced at node n1 and node n2 that are substantially equal and opposite with respect to each other.

The upper RLC network 20 may be matched with the lower RLC network 30, such that the characteristics (e.g., resistances, capacitances, inductances, and the like) of the components of the networks are substantially identical. According to some example embodiments, the switching device 40 may be connected between inductors (also referred to as windings or coils) L1 and L2, which may be matched and tightly coupled. The inductors L3 and L4 may also be matched and tightly coupled.

As used herein, the term "float" may be used to indicate that a device is not connected to a fixed potential (e.g., +Vcc or ground). For example, a device may be floating if it is connected through non-zero impedance components, such as inductors or capacitors to a fixed potential. As such, the potential at a terminal of a floating component may tend to wander or float with respect to a fixed potential.

The switching device 40, which may be embodied as a transistor (e.g., a field effect transistor or the like), may switch open or closed in response to a control or drive signal, such as the square wave depicted in FIG. 1. According to various example embodiments, the currents I1 and I2 in the upper and lower networks are in opposite directions in the respective networks. As result of the switching operations performed by the switching device 40 and currents I1 and I2, differential output signals may be generated at nodes n1 and n2. Due to the coupling effect of the L3 inductor with the L4 inductor, the differential output signals generated at nodes n1 and n2 may interact to eliminate noise present in the input signal. As such, the load $R_L$ may receive a signal having an associated reduction in both conducted and radiated noise.

As stated above, the coupling between inductors L3 and L4, may facilitate the reduction in noise provided by the amplifier. To maximize noise cancellation, inductors L3 and L4 may be positioned as close together as possible so that the inductors are strongly coupled. In practice, a designer may desire to come as close as possible to the hypothetical case of complete noise cancellation, while still avoiding the perfect cancellation of signals. According to some example embodiments, a pair of strongly coupled inductors may be used that are combined in a single package, such as the Coiltronix DRQ127-470-R, which results in the inductors being as closely coupled as possible. As a result of the strong coupling, the current in each of the inductors may be forced to be almost equivalent in value, facilitating the generation of the inversely oriented signals. According to example embodiments where the inductors are not included in the same package (e.g., a wireless power system), the inductors L3 and L4 may be inter-wounded coils used for transmitting wireless power to one or more secondary coils and may utilize strong coupling by maintaining the inductors in close proximity.

FIG. 2a depicts another example embodiment of the present invention in the form of a single switching device differential drive amplifier 50 for use with a wireless power system. FIG. 2a depicts the inductors L1 and L2 of FIG. 1 as the "coupled inductors" of the amplifier 50 and the inductors L3 and L4 of FIG. 1 as the "transmitting coils" (also referred to as primary coils) of amplifier 50. Within a wireless power system the transmitting coils may be configured to induce a current in one or more secondary coils (not depicted) to provide wireless power to a load connected to the one or more secondary coils, such as to charge a battery or otherwise provided power to operate a device. Additionally, amplifier 50 reduces the number of components by combining the capacitors $C_o$ in FIG. 1 into a single capacitor $C_o/2$ (having half the capacitance rating).

FIG. 2b depicts yet another example embodiment of a single switching device differential drive amplifier 60. The amplifier 60 employs a further reduction in the number of components by modifying the capacitance network between node n1 and node n2 to eliminate the two capacitors C and the common ground, and to include a single shunt capacitor C/2 (having half the capacitance rating). According to some example embodiments, the single shunt capacitor may be replaced by a number of capacitors where the combined capacitance is C/2.

As described with respect to FIGS. 1, 2a, and 2b, a single switching device differential drive amplifier may be provided according to various example embodiments of the present invention. The switching device 40 utilized by various example embodiments may be any means for performing switching with respect to a control signal. According to various example embodiments, the switching device may comprise a transistor, such as the field effect transistor 70 depicted in FIG. 3. The transistor 70 is an n-type metal oxide semiconductor (NMOS). An NMOS transistor may be used to control switching between the drain (D) and source (S) terminals which is accomplished by controlling the terminals at the gate (G) and source (S). An NMOS may normally operate in an OFF mode (or the switch is open between drain and source), and transitions to an ON mode (or the switch closes between drain and source) if a positive voltage is applied at gate compared to the voltage at the source.

As such, the gate of the transistor 70 may be connected to a control signal or a drive signal for controlling the conductivity from the source to the drain. In this regard, an input signal to the gate may alter a conductive state of the transistor. As described further below, the gate of the transistor 70 (or another switching device) may be connected to a drive signal provided by a drive circuit. The drain may constitute a first output node and may be connected to a supply voltage through an inductor. The source may constitute a second output node, and may be connected to ground through an inductor.

The transistor 70 illustrates one example switching device that may be implemented in accordance with various example embodiments. Other types of switching devices may also be implemented in accordance with example embodiments. For example, the switching device may be embodied as, or part of, a processor (e.g., a signal processor), an application specific integrated circuit (ASIC), a field programmable gate array (FPGA), or the like.

FIG. 4 illustrates a drive circuit 80 in accordance with some example embodiments. The drive circuit 80 may receive an input signal at 81 and provide a drive signal at 84 to the gate of the switching device 40. The drive signal at 84 may be generated via a gate drive transformer 82 and an h-bridge network 83. According to some example embodiments, to generate the drive signal at 84 for a switching device, an isolated drive scheme may be implemented using the transformer 82. According to some example embodiments, the transformer 82 may be a pulse transformer. The transformer 82 may sense the voltage difference across its input terminals and apply the same voltage across its output terminals. By connecting the output terminals of the transformer 82 across the gate and source of the switching device 40, switching may be performed even though the source and the drain are floating between n1 and n2.

In some example embodiments, the switching device 40 may be designed to switch at a rapid speed, which may require a rapidly changing drive signal at the gate of the switching device. To achieve the rapidly changing drive signal, the h-bridge circuit 83 may be utilized. Referring to FIG. 4, the h-bridge circuit 83 may include diodes, D1 and D2, and bipolar junction transistors (BJTs), B1 and B2. The diodes and the capacitors, C1 and C2, may form a voltage doubler circuit, which may be used to generate a direct current (DC) voltage across nodes n4 and n2. The BJTs may be set in a push-pull configuration to drive the gate of switching device 40 using this DC voltage. A push-pull configuration may rely on several inherent characteristics of BJTs. B1 may be a PNP transistor and act as a closed switch between the collector (connected to node n4) and emitter (connected to node ng), while the BJTs base voltage (connected to node n3) may be higher than the voltage at the emitter. On the other hand, B2 may be an NPN transistor and act as a closed switch between its collector (connected to node n2) and emitter (connected to node ng) while its base voltage (connected to node n3) may be lower than the voltage at the emitter. When not operating as a closed switch both B1 and B2 may act as open switches.

When the transformer forces node n3's voltage higher than the voltage at node n2, B1 may sense a positive voltage between its base and emitter terminals resulting in current flowing from the capacitor C1 to the gate of switching device 40. Likewise, B2 may sense the lower voltage between its base and its emitter causing the gate of switching device 40 to discharge to node n2. As a result, the h-bridge 83 provides for fast ramp up and ramp down of the voltage of the signal at the gate of switching device 40 (with respect to the source) thereby allowing for rapid switching.

FIG. 5 depicts an example wireless power system in accordance with various example embodiments of the present invention. The wireless power system of FIG. 5 may include a wireless power transmitter 102 and a wireless power receiver 104. The wireless power transmitter 102 may include a differential drive amplifier 100, which, in turn, may include a single switching device 110 and a drive circuit 120. The drive circuit 120 may receive an input signal 121. The wireless power transmitter 102 may also include a supply network 130 and primary coils 140. The wireless power receiver 104 may include secondary coils 150, a rectifier 160, and a load 170, which may be a dynamic load. In some example embodiments, the load 170 may be rechargeable battery for an electronic device.

According to various example embodiments, the wireless power system of FIG. 5 implements switching operations to convert a DC voltage provided by the supply network 130 into a high frequency signal. The differential drive amplifier 100 may operate, as described above, to generate two high frequency output signals that are differential and substantially equal and opposite. The differential output signals may be delivered to respective primary coils that are positioned to provide for noise cancellation through a coupling of the primary coils 140. The primary coils 140 may be oriented such that the currents in the coils flow in the same direction, thereby providing for noise cancellation while also having a minimal effect on the magnetic field generation of the primary coils 140. Due to the direction of the current, magnetic fields may be generated that have the same polarity. The magnetic field may induce a current in the one or more secondary coils of the wireless power receiver 150. The one or more secondary coils 150 may receive an induced alternating current (AC) signal, which may then be rectified, via the rectifier 160, and fed to a load 170.

FIG. 6 illustrates a more detailed schematic diagram of a wireless power transmitter. As stated above, the differential drive amplifier 100 may utilize a DC supply provided by the supply network 130. The supply network 130 may include two, tightly coupled choke inductors (LDC) 131 and 132 which can feed the DC voltage to the drain and source terminals of the switching device 110. According to some example embodiments, the tight coupling of the choke inductors 131 and 132 can be partially responsible for aligning the phases of the high and low sides of the differential drive amplifier outputs.

The switching device 110 may comprise a transistor that is floating on an AC input at the gate terminal. An isolated drive circuit 120 may provide the signal to the gate terminal by receiving an input signal at 121 and providing a drive or control signal to the gate of the switching device 110 at 124. Similar to the isolated drive circuit illustrated in FIG. 4, the isolated drive circuit 120 may include a transformer 122 and an h-bridge 123. L1 and R1 may be included to soften the changes (dV/dT) in the drive signal and prevent high order harmonics from being created. According to various example embodiments, the drive circuit 120 assists the switching device 110 in maintaining zero-voltage switching across various loading conditions.

In some example embodiments, the drive circuit may provide a step function input signal to the switching device 110. FIG. 7 illustrates example differential output signals with respect to ground that be generated at the output nodes of the switching device based on a step function input signal. The step function may generate differential output signals that are half-sine signals. Signal 111 may be a positive output signal that may be captured at the drain of the switching device 110. Signal 112 may be a negative output signal that may be captured at the source of the switching device 110. It is noteworthy that signals 111 and 112 are substantially equal in magnitude, but opposite in polarity relative to a reference voltage. In the example illustrated in FIG. 7, the reference voltage is approximately 6 volts. However, in accordance with various example embodiments, the reference voltage may be, for example, zero volts.

The shunt capacitor network 101, the balance capacitor network 103, and the primary coil network 180 of FIG. 6 may be included in a load network. A wireless power system in accordance with example embodiments may also include a receiver (not shown in FIG. 6) including one or more secondary coils and a rectifier to receive power from the primary coils 140a and 140b. In some example embodiments, the receiver may also be included in the load network.

The shunt capacitor network 101 may be connected between the output nodes (e.g., the drain and the source) of the switching device 110. The shunt capacitor network 101 of FIG. 6 includes a single capacitor 102, however, some example embodiments of the present invention may include a number of capacitors within the shunt capacitor network 101. According to some example embodiments, the shunt capacitor network 101 facilitates tuning the switching device 110 for zero-voltage switching when the switching device 110 is implemented as a transistor. In this regard, charge may be alternatively stored and released from shunt capacitor network 102 in response to the switching operations.

The balance capacitor network 103 may include a number of capacitors (e.g., capacitors 104, 105, and 106) that are used to provide an isolated ground reference, which may contribute to improved balance between the differential drive amplifier output signals. According to some example embodiments, capacitors 104 and 105 may be matched. The connections to ground included in the balance capacitor network 103 may also provide a path to shunt high-frequency noise to ground.

The primary coil network 180 may include primary coils 140a and 140b and series capacitor 141 connected between and in series with the coils. Alternatively, in some example embodiments, the primary coil network 180 may include a single primary coil. In a two coil network, the primary coils 140a and 140b may be a pair of equal-length coils that are tightly coupled. The tight coupling of the two primary coils may also facilitate maintaining the phase relationship between the differential amplifier output signals. By positioning the primary coils 140a and 140b such that current flows through the coils in the same direction, the primary coils 140a and 140b may co-locate voltages with equal and opposite potential and reduce noise emissions. Because the currents flow through the primary coils 140a and 140b in the same direction, the magnetic fields generated by the coils are unaffected or substantially unaffected. The magnetic fields generated by the first coil and the second coil may have the same polarity. The series capacitor 141 may be connected between the primary coils to facilitate bringing the load into a phase angle that is suitable from the perspective of the differential drive amplifier. In some example embodiments, as an alternative to the series capacitor, a first capacitor may be connected between the first output node of the switching device and the first coil, and a second capacitor may be connected between the second output node of the switching device and the second coil. The first and second capacitors may have capacitance ratings that are double the capacitance of the series capacitor 141. According to the some example embodiments, the first and second capacitors may be implemented in conjunction with a primary coil network that includes a single coil.

According to some example embodiments, the primary coil network 180 may be configured to facilitate noise cancellation by co-locating substantially equal and opposite voltages at any location on a planar surface defined by the primary coil network. According to some example embodiments, the primary coil network 180 may be configured to co-locate substantially equal and opposite voltages at any location in a three-dimensional space surrounding the primary coil network 180. According to various example embodiments the primary coils may be driven by differential output signals as described above. However, according to some example embodiments, the primary coil arrangements and configurations described herein may be utilized in conjunction with any type of differential drive amplifier, including but not limited to a single switching device differential drive amplifier as described herein. For example, the primary coil arrangements and configurations may be used with a differential drive amplifier that includes multiple switching devices and/or transistors.

With respect to the positional configuration of the primary coils, each primary coil may be wound as a spiral on a geometric plane. To facilitate co-location of voltages, the distance between each turn of a coil may be increased as the spiral configuration moves towards the center of an area. The first coil and the second coil may therefore have a spiral configuration within a common plane that provides for co-location of substantially equal and opposite voltages within the first and second coils, respectively, at any location on the common plane. According to some example embodiments, a single coil may be utilized that spirals into a center point or area, and then spirals back out. As such, a coil arrangement may be constructed of two coils that are connected at a central location to achieve a single coil example embodiment.

FIG. 8 illustrates a two coil arrangement according to various example embodiments of the present invention. FIG. 9 illustrates the example embodiment of FIG. 8 with only the first coil being depicted. FIG. 10 illustrates the example embodiment of FIG. 8 with only the second coil being depicted.

FIG. 11 illustrates a two coil arrangement oriented on a coordinate system axis for measuring distances from the center or origin. When differential output signals are applied to the coils, co-location of substantially equal and opposite voltages can be achieved. To illustrate the effect of the coil configurations, voltages may be measured at each turn of the coils. Each turn is associated with a particular location on the coordinate system. FIG. 12 depicts a graph of the voltages measured at each turn. The data points with voltages above zero are associated with measurements taken at turns of a first coil, and the data points with voltage below zero are associated with measurements taken at turns of a second coil. Since the turns are positioned at a particular distance from the center, the horizontal axis can be defined with respect to distance. As indicated by the data points, measurements taken on the first coil and on the second coil have equal and opposite voltages at the same or substantially the same distance from the center.

In addition to, or as an alternative to, arranging a primary coil network as described above, a secondary coil network may be arranged in a similar manner. In this regard, the coil arrangements may also be implementing in a receiver of a wireless power system. The secondary coil network may utilize a center tap to ground coil configuration with similar coil geometry to achieve similar results.

FIG. 13 depicts another example embodiment of the present invention in the form a wireless power transmitter that includes a single switching device differential drive amplifier. The wireless power transmitter of FIG. 7 is similar to wireless power transmitter depicted in FIG. 6, in that, the wireless power transmitter of FIG. 7 includes a supply network, a drive circuit, a switching device, a shunt capacitor network, a balance capacitor network, and a primary coil network. Part identifiers, passive device values, and part characteristics are also provided, by way of example, for the elements of the example embodiment of FIG. 7. Similarly, FIG. 14 depicts yet another example embodiment of a differential drive amplifier that is not connected to a primary coil network.

Various example methods of the present invention may also be provided that include method operations derived from the apparatuses described above. One example method is depicted in FIG. 15. The example method of FIG. 15 includes receiving a drive signal from a drive circuit at a switching device at 200, and altering a conductive state of the switching device based on the drive signal at 210. By altering a conductive state of the switching device, a first output signal at a first output node and a second output signal at a second output node may be produced. The first and second output signals may be substantially equal in magnitude but opposite in polarity relative to a reference voltage. The example method may also include driving a load network with the first output signal and the second output signal via the first output node and the second output node, respectively at 220.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims. Although specific terms are employed herein, they are used in a generic and descriptive sense only and not for purposes of limitation.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. An apparatus for reducing an amplifier output noise, comprising:
a switching device having a conductive state and configured to receive a drive signal, the switching device coupled to a first output node and a second output node, the conductive state altered based on the drive signal to produce a first output signal having a first current value at the first output node and a second output signal having a second current value at the second output node, the first and second current values substantially equal in magnitude; and
a first coil driven by the first output node; and
a second coil driven by the second output node, the first coil and the second coil configured to wirelessly output power at a level sufficient to power or charge a receiver device.

2. The apparatus of claim 1, wherein the switching device is configured to float between the first output and the second output node, the first output node coupled with ground through a first choke inductor and the second output node coupled with a supply voltage through a second choke inductor.

3. The apparatus of claim 2, wherein the first choke inductor and the second choke inductor are positioned to have a coupling effect.

4. The apparatus of claim 1, further comprising a drive circuit configured to generate the drive signal.

5. The apparatus of claim 4, wherein the drive circuit is an isolated drive circuit comprising a transformer.

6. The apparatus of claim 1, further comprising a capacitance network coupled between the first output node and the second output node, the capacitance network including one or more capacitors between the first output node and the second output node.

7. The apparatus of claim 1, further comprising a capacitance network, the capacitance network including one or more capacitors between the first output node and ground, and one or more capacitors between the second output node and the ground.

8. The apparatus of claim 1, wherein the first coil and the second coil are arranged such that currents through the first coil and the second coil generate respective magnetic fields having the same polarity.

9. The apparatus of claim 1, wherein one or more capacitors is included between the first coil and the second coil.

10. The apparatus of claim 1, further comprising a differential drive amplifier comprising the switching device, the first output node, and the second output node.

11. A method for reducing an amplifier output noise, comprising:
receiving a drive signal from a drive circuit at a switching device;
altering a conductive state of the switching device based on the drive signal to produce a first output signal having a first current value at a first output node and a second output signal having a second current value at a second output node, the first and second current values being substantially equal in magnitude; and
driving a first coil with the first output signal by the first output node and a second coil with the second output signal by the second output node; and
wirelessly outputting power by the first coil and the second coil at a level sufficient to power or charge a receiver device.

12. An apparatus for reducing an amplifier output noise, comprising:
means for receiving a drive signal from a drive circuit at a switching device;
means for altering a conductive state of the switching device based on the drive signal to produce a first output signal having a first current value at a first output node and a second output signal having a second current value at a second output node, the first and second current values being substantially equal in magnitude; and means for driving a first coil with the first output signal by the first output node and a second coil with the second output signal by the second output node, the first coil and the second coil configured to wirelessly output power at a level sufficient to power or charge a receiver device.

13. An apparatus for powering or charging a device, comprising:

a first coil driven by a first signal having a first current value; and a second coil driven by a second signal having a second current value, the first and second current values being substantially equal in magnitude, the first coil and the second coil having a spiral configuration within a common plane that provides for co-location of substantially equal and opposite voltages within the first and second coils, respectively, at substantially any location on the common plane, the first coil and the second coil configured to wirelessly output power at a level sufficient to power or charge a receiver device.

14. The apparatus of claim 13, wherein the first coil is physically connected to the second coil at a central point to generate a single coil arrangement.

15. The apparatus of claim 1, wherein the first coil and the second coil are positioned to have a coupling effect.

16. The method of claim 11, wherein the switching device is configured to float between the first output node and the second output node, the first output node coupled with ground through a first choke inductor and the second output node coupled with a supply voltage through a second choke inductor.

17. The method of claim 16, wherein the first choke inductor and the second choke inductor are positioned to have a coupling effect.

18. The method of claim 11, wherein the first coil and the second coil are positioned to have a coupling effect.

19. The apparatus of claim 12, wherein the switching device is configured to float between the first output node and the second output node, the first output node coupled with ground through a first choke inductor and the second output node coupled with a supply voltage through a second choke inductor.

20. The apparatus of claim 19, wherein the first choke inductor and the second choke inductor are positioned to have a coupling effect.

21. The apparatus of claim 12, wherein the first coil and the second coil are positioned to have a coupling effect.

22. The apparatus of claim 1, wherein the switching device comprises a single switching device.

23. The method of claim 11, wherein the switching device comprises a single switching device.

24. The apparatus of claim 12, wherein the switching device comprises a single switching device.

25. The apparatus of claim 1, wherein the first coil and the second coil are connected at a central point to generate a single coil arrangement.

26. The method of claim 11, wherein the first coil and the second coil are connected at a central point to generate a single coil arrangement.

27. The method of claim 11, further comprising generating the drive signal with the drive circuit.

28. The method of claim 27, wherein the drive circuit is an isolated drive circuit comprising a transformer.

29. The method of claim 11, wherein the switching device comprises a capacitance network coupled between the first output node and the second output node, the capacitance network including one or more capacitors between the first output node and the second output node.

30. The method of claim 11, wherein the switching device comprises a capacitance network, the capacitance network including one or more capacitors between the first output node and ground and one or more capacitors between the second output node and the ground.

31. The method of claim 11, wherein the first coil and the second coil are arranged such that currents through the first coil and the second coil generate respective magnetic fields having the same polarity.

32. The method of claim 11, wherein the switching device includes one or more capacitors between the first coil and the second coil.

33. The method of claim 11, wherein a differential drive amplifier comprises the switching device, the first output node, and the second output node.

34. The apparatus of claim 12, wherein the first coil and the second coil are connected at a central point to generate a single coil arrangement.

35. The apparatus of claim 12, further comprising means for generating the drive signal, the means for generating the drive signal comprising the drive circuit.

36. The apparatus of claim 35, wherein the drive circuit is an isolated drive circuit comprising a transformer.

37. The apparatus of claim 12, further comprising means for capacitively coupling the first output node and the second output node, the means for capacitively coupling including one or more capacitors between the first output node and the second output node.

38. The apparatus of claim 12, further comprising first means for capacitively coupling the first output node and ground and second means for capacitively coupling the second output node and the ground, the first means for capacitively coupling including one or more capacitors between the first output node and the ground, the second means for capacitively coupling including one or more capacitors between the second output node and the ground.

39. The apparatus of claim 12, wherein the first coil and the second coil are arranged such that currents through the first coil and the second coil generate respective magnetic fields having the same polarity.

40. The apparatus of claim 12, further comprising means for capacitively coupling the first coil and the second coil, the means for capacitively coupling including one or more capacitors between the first coil and the second coil.

41. The apparatus of claim 12, wherein a differential drive amplifier comprises the switching device, the first output node, and the second output node.

42. A method for powering or charging a device, comprising:

driving a first coil by a first signal having a first current value; and driving a second coil by a second signal having a second current value, the first and second current values being substantially equal in magnitude, the first coil and the second coil having a spiral configuration within a common plane that provides for co-location of substantially equal and opposite voltages within the first and second coils, respectively, at substantially any location on the common plane, the first coil and the second coil configured to wirelessly output power at a level sufficient to power or charge a receiver device.

43. The method of claim 42, wherein the first coil is physically connected to the second coil at a central point to generate a single coil arrangement.

44. An apparatus for powering or charging a device, comprising:
- means for driving a first coil by a first signal having a first current value; and
- means for driving a second coil by a second signal having a second current value, the first and second currents being substantially equal in magnitude, the first coil and the second coil having a spiral configuration within a common plane that provides for co-location of substantially equal and opposite voltages within the first and second coils, respectively, at substantially any location on the common plane, the first coil and the second coil configured to wirelessly output power at a level sufficient to power or charge a receiver device.

45. The apparatus of claim 44, wherein the first coil is physically connected to the second coil at a central point to generate a single coil arrangement.

\* \* \* \* \*